(12) United States Patent  
Pedoeem et al.

(10) Patent No.: US 8,558,122 B2
(45) Date of Patent: Oct. 15, 2013

(54) COMPOSITE CONDUCTIVE PLASTIC FILLER PANEL

(75) Inventors: Albert Pedoeem, West Orange, NJ (US); Mahesh Mistry, Parsippany, NJ (US)

(73) Assignee: Fujitsu Limited, Kawasaki-shi (JP)

( * ) Notice: Subject to any disclaimer, the term of this patent is extended or adjusted under 35 U.S.C. 154(b) by 588 days.

(21) Appl. No.: 12/712,030

(22) Filed: Feb. 24, 2010

(65) Prior Publication Data

US 2011/0203844 A1   Aug. 25, 2011

(51) Int. Cl.
*H05K 9/00*   (2006.01)

(52) U.S. Cl.
USPC ......................................... 174/382; 361/800

(58) Field of Classification Search
USPC ..................... 174/377, 382; 361/800, 816
See application file for complete search history.

(56) References Cited

U.S. PATENT DOCUMENTS

| | | | |
|---|---|---|---|
| 6,940,731 B2 * | 9/2005 | Davis et al. | 361/801 |
| 7,589,978 B1 * | 9/2009 | Holdredge et al. | 361/818 |
| 2002/0070044 A1 * | 6/2002 | Pommerenke et al. | 174/521 |
| 2005/0061529 A1 * | 3/2005 | Omura et al. | 174/521 |
| 2006/0037768 A1 * | 2/2006 | Cochrane | 174/35 GC |
| 2006/0249305 A1 * | 11/2006 | Egner et al. | 174/382 |

* cited by examiner

*Primary Examiner* — Hung Ngo
(74) *Attorney, Agent, or Firm* — Baker Botts L.L.P.

(57) ABSTRACT

A filler panel for blocking an unused portion of a communications system. That filler panel may include an electromagnetic shielding base and a base cover removably coupled to the electromagnetic shielding base. The filler panel may also include an air dam composed substantially of low-cost, non-conductive material coupled to either the electromagnetic shielding base or to the base cover through the electromagnetic shielding base.

14 Claims, 4 Drawing Sheets

COMPOSITE CONDUCTIVE PLASTIC FILLER PANEL

TECHNICAL FIELD

This disclosure relates in general to electronic card shelf systems and more particularly to a composite conductive plastic filler panel.

BACKGROUND

The infrastructure behind modern electronic systems increasingly requires deployment of multiple communication devices in systems that consolidate the various device components into racks or shelves, which may reduce the storage and operation space required by the owner of the infrastructure as well as easing the effort required for operation or maintenance. The devices stored in these racks or shelves may include communication network components such as amplifiers, switches, network management cards, network interface cards, or other devices. However, in many instances not all available space within the rack is in use at a given point in time.

Filler panels are devices used to fill the unused space in such a rack or shelf. These panels serve many uses, including electromagnetic shielding (to ensure proper operation of the system components), prevention of air leakage throughout the system, improved thermal management of the shelf, and aesthetic appearance of the rack as a whole. Existing filler panels, while functional, tend to be expensive and difficult to customize for individual users or end-users.

As more electronics infrastructure is stored and operated in consolidated racks or shelves, manufacturers and suppliers of such racks face increasing challenges in maintaining performance levels required by end-users while reducing the manufacturing and operating costs.

SUMMARY OF THE DISCLOSURE

The present disclosure provides a composite conductive filler panel that substantially eliminates or reduces at least some of the disadvantages and problems associated with previous methods and systems.

According to one embodiment, a filler panel is provided for blocking an unused portion of an electronics shelf system. That filler panel may include an electromagnetic shielding base configured to be removably coupled to an substantially cover the unused slot of the electronics shelf system, and a base cover configured to be removably coupled to the electromagnetic shielding base. The filler panel may also include an air dam composed substantially of low-cost, nonconductive material coupled to either the electromagnetic shielding base or to the base cover through the electromagnetic shielding base.

Also provided is an electronics shelf system for supporting an electronics device, comprising a shelf and a filler panel configured to be removably coupled to the shelf. That filler panel may include an electromagnetic shielding base configured to substantially cover an unused slot of the shelf, and a base cover configured to be removably coupled to the electromagnetic shielding base. The filler panel may also include an air dam composed substantially of low-cost, nonconductive material coupled to either the electromagnetic shielding base or to the base cover through the electromagnetic shielding base.

Technical advantages of certain embodiments of the present disclosure include providing an efficient means of manufacturing filler panels such that electromagnetic shielding requirements are met, while still providing the manufacturer or supplier flexibility in production costs and end-user customization. More particularly, this approach allows for a modular design and manufacture of filler panels in a way that reduces the manufacturing cost while maintaining performance. Further, the end-user is given greater options both in deciding the aesthetic look of a filler panel and in handling that panel after it is delivered. Other technical advantages will be readily apparent to one skilled in the art from the following figures, descriptions, and claims. Moreover, while specific advantages have been enumerated above, various embodiments may include all, some or none of the enumerated advantages.

BRIEF DESCRIPTION OF THE DRAWINGS

For a more complete understanding of the present invention and its advantages, reference is now made to the following description, taken in conjunction with the accompanying drawings, in which.

DETAILED DESCRIPTION OF THE INVENTION

Figure 1:
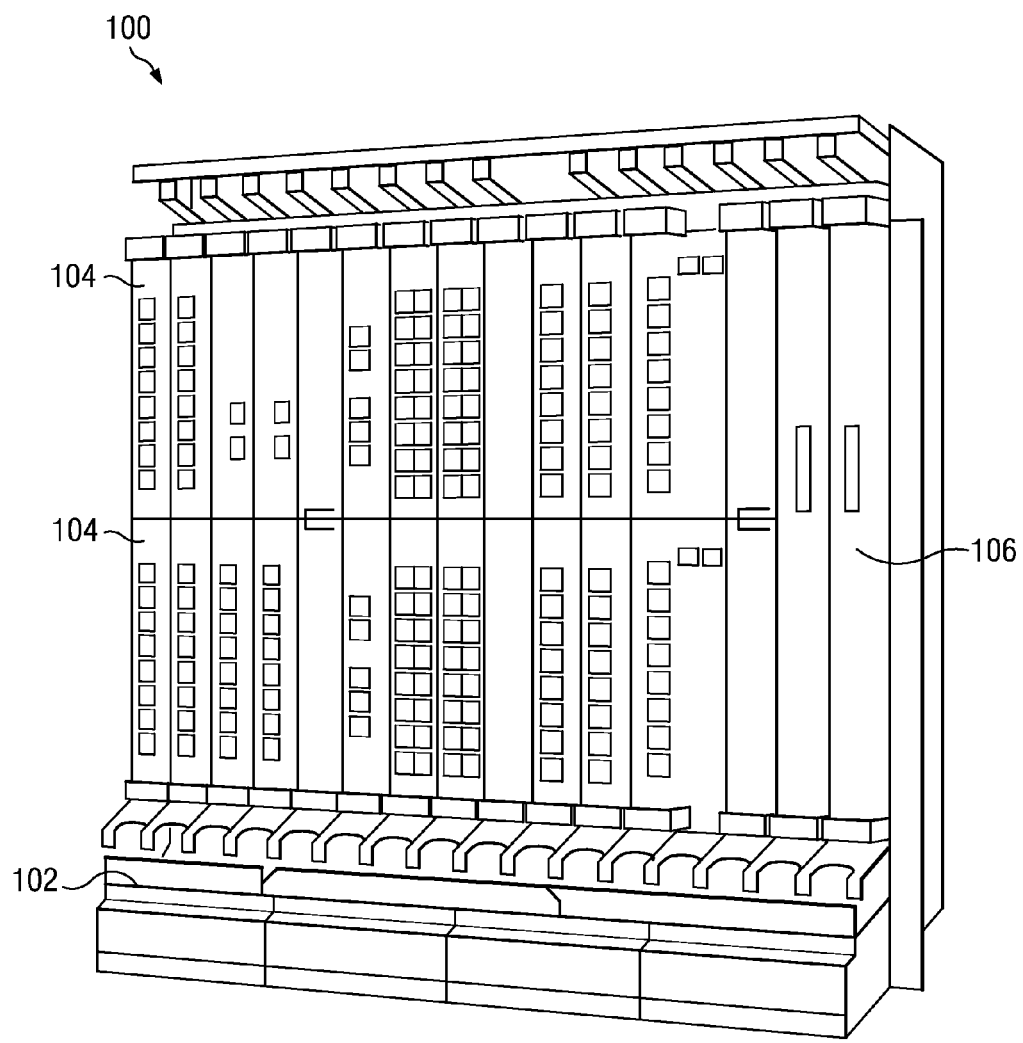
FIG. 1 illustrates a system for supporting one or more communication devices, according to certain embodiments of the present disclosure.
Figure 2A:
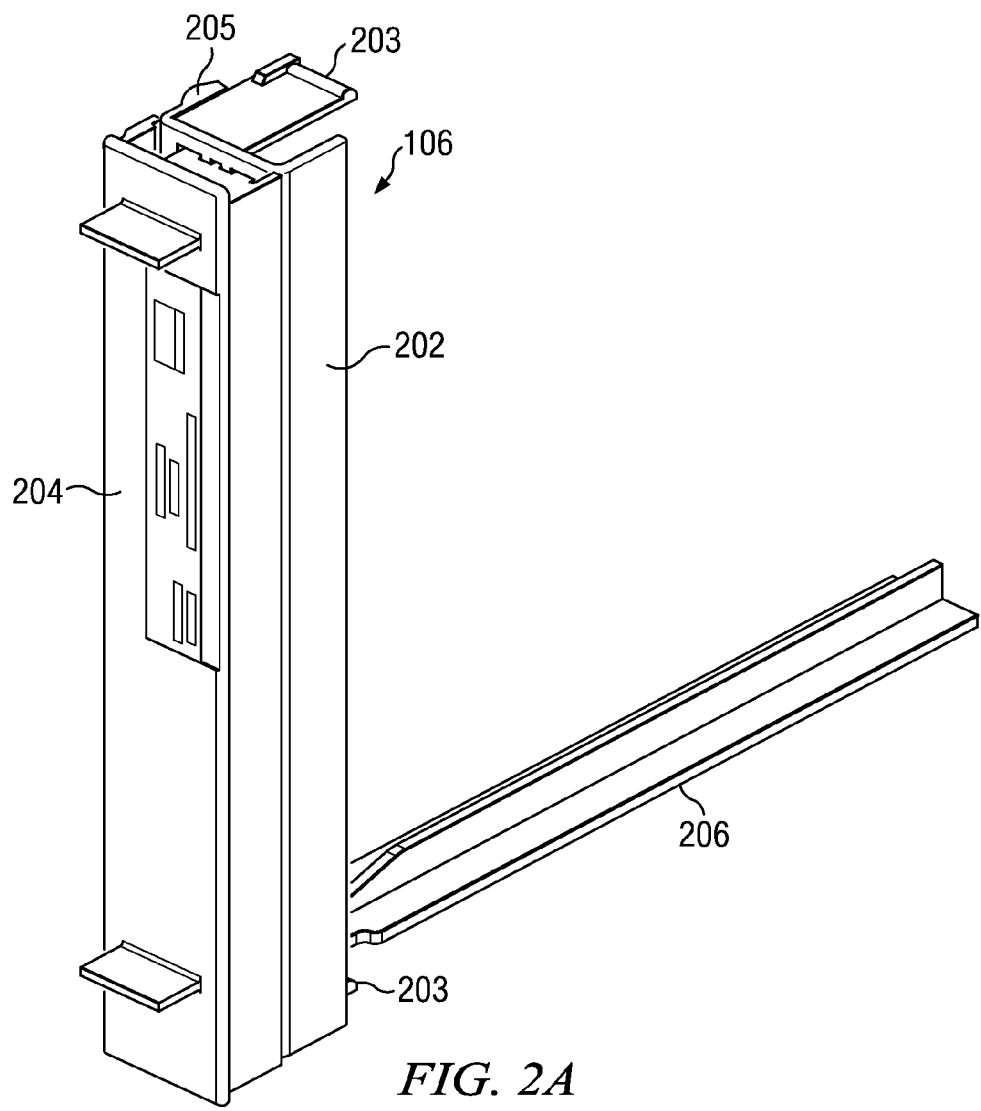
FIG. 2A illustrates an example filler panel, according to certain embodiments of the present disclosure.
Figure 2B:
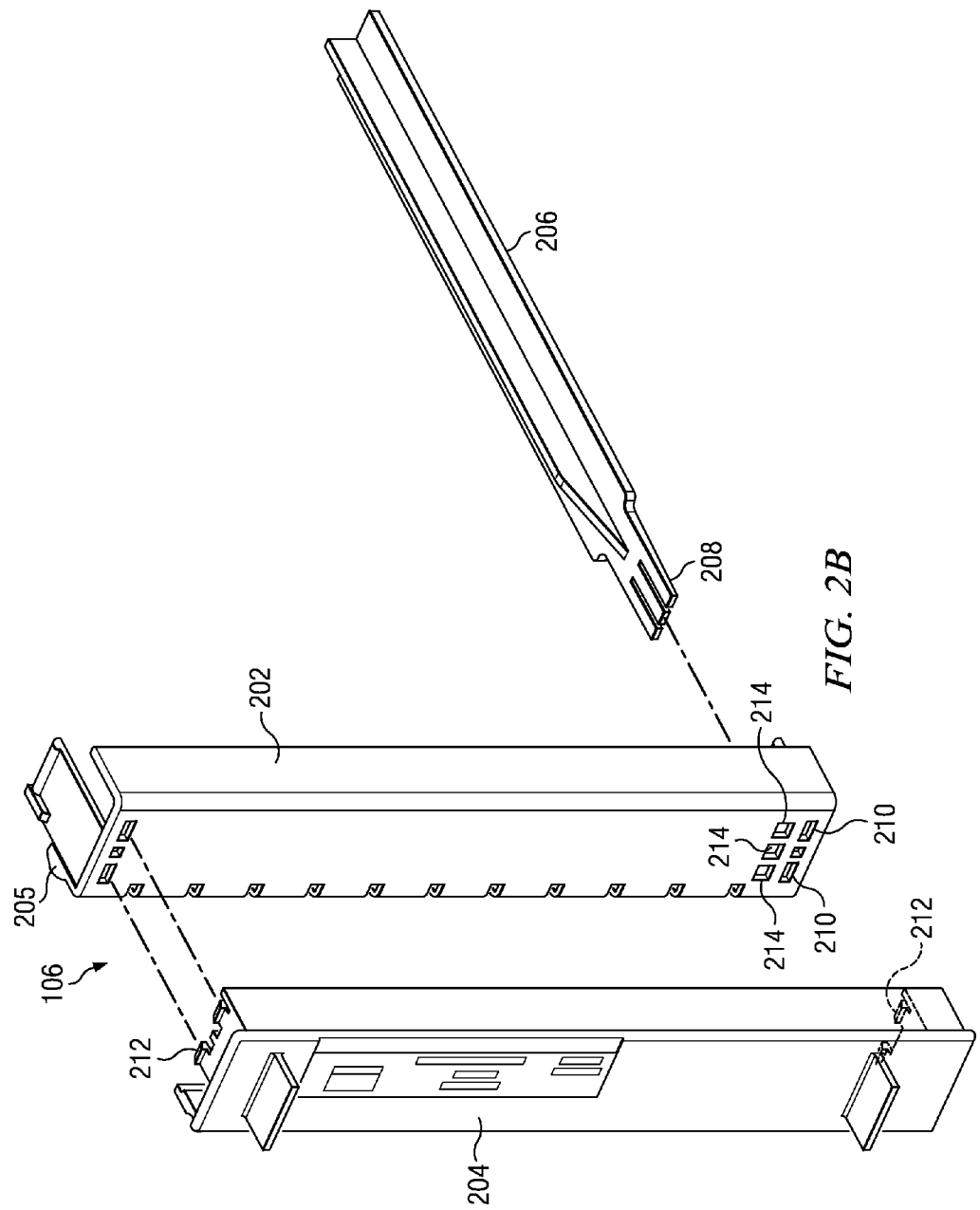
FIG. 2B illustrates example filler panel separated into its components, according to certain embodiments of the present disclosure.
Figure 3:
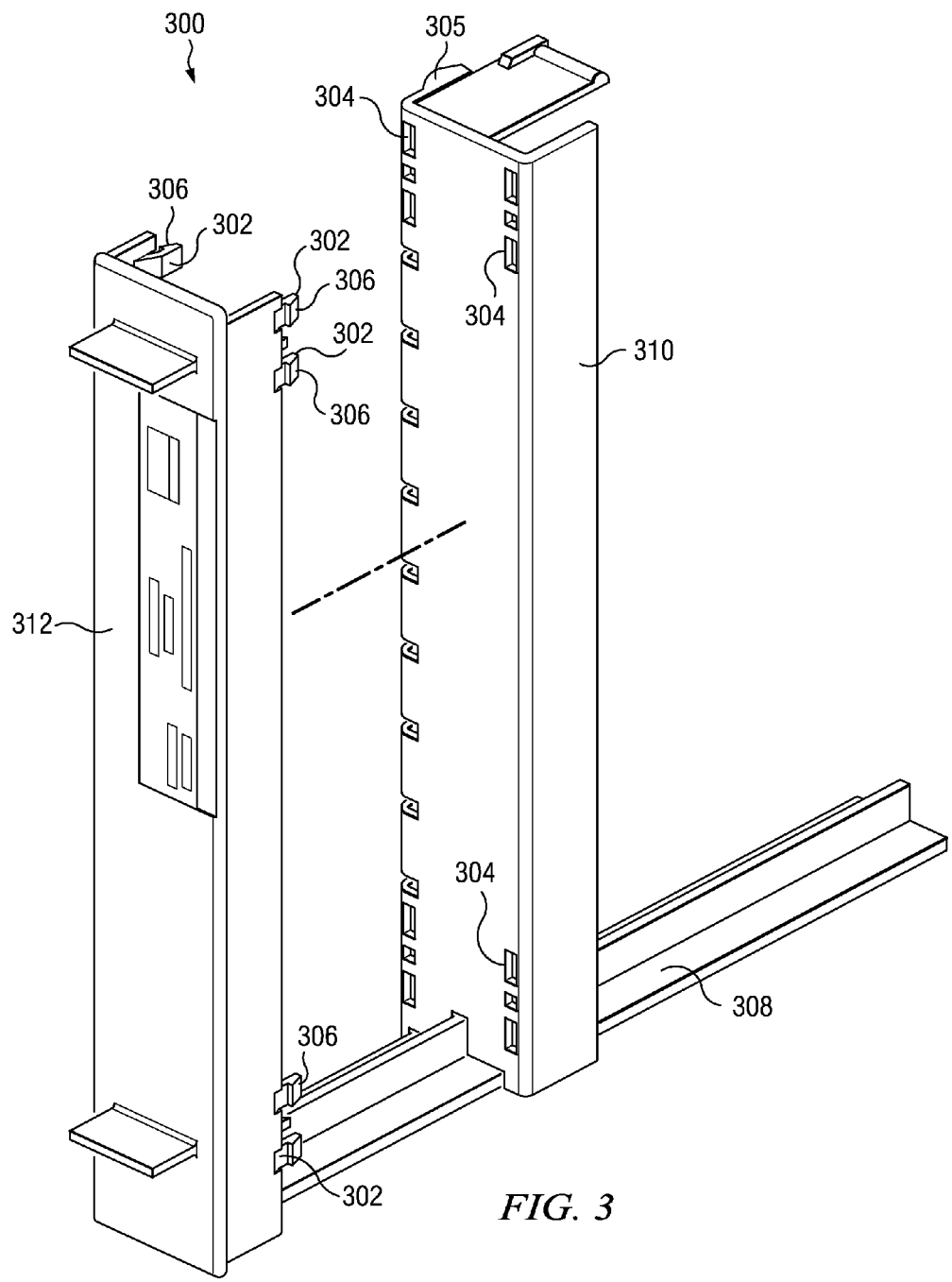
FIG. 3 illustrates an example filler panel, according to certain embodiments of the present disclosure.

Preferred embodiments and their advantages are best understood by reference to FIGS. 1 through 3, wherein like numbers are used to indicate like and corresponding parts.

For the purposes of this disclosure, an electronic device may include any device or component configured for use in an electronics system, whether optical, mechanical, electrical, or otherwise. For example, an electronic device may be an optical amplifier card, a network storage device, a network interface card, multiplexor, or other device or component used in an electronics system and configured to be stored, maintained, and/or operated within a storage shelf or rack. Such a shelf or rack may be of standard size that accepts modular components, or may be custom-built and sized for a particular purpose. An electronic device may also include any electronic device or component configured for storage and/or operation in a rack or shelf system, such as a computer server that houses server blades or other circuit boards in a shelf. FIGS. 1 through 3 below use as an illustrative example a standard-sized shelf for use in an optical networking environment. However, this should not be seen to limit the scope of the present disclosure. For instance, the filler panel disclosed herein may be applicable to other environments, such as the storage and operation of computer servers, RF/Microwave equipment, or other devices requiring the use of electromagnetic shielding and blockage of open space within a storage shelf or rack.

FIG. 1 illustrates a system 100 for supporting one or more communication devices 104, according to certain embodiments of the present disclosure. System 100 includes a shelf 102 supporting one or more communication devices 104, and one or more filler panel(s) 106. In some embodiments, system 100 may be a shelf for use in optical networking, such as the Fujitsu Flashwave 9500 series platform. Filler panel(s) 106 may be used when all of the space within shelf 102 is not currently taken by communications devices 104. For instance, the manufacturer of system 100 may provide expansion slots within shelf 102 so that the end-user may later expand his/her use of system 100 without needing to purchase additional units.

However, due to the close proximity of multiple communication devices 104 within shelf 102, the aggregate electromagnetic fields produced by communication devices 104, which may be significant, may leak from system 100. Thus, filler panels 106 may be composed of materials that provide for electromagnetic shielding in order to prevent this leakage. There are two primary, related difficulties in creating filler panels with the requisite level of electromagnetic shielding. The most difficult of these is cost. Various known materials may provide acceptable levels of electromagnetic shielding. For instance, conductive polymers, such as plastics impregnated with conductive fibers (e.g., steel), may be used for filler panels 106. While conductive polymers offer a less expensive alternative to using metallic or other conductive materials for manufacture of filler panels 106, these materials remain expensive. Additionally, the material properties of this relatively new class of materials remains poorly understood in comparison to traditional conductive materials (e.g., metals) or traditional, nonconductive plastics.

The second, related difficulty is aesthetics. The presence of the conductive material within a conductive polymer may make it difficult or impossible to provide a customized or matchable color or design to a specific end-user. The properties of traditional metallic conductors, whether used alone or as a fiber within the conductive polymer, increase the variability of coloring filler panel 106. As a result, the aesthetic appeal of filler panels 106 from different batches, or obtained at different times, may be undesirable in the eyes of the end-user.

One solution to both difficulties is to manufacture only a portion of filler panel 106 from a conductive material, while using less expensive, materials that may be more readily customizable for the remainder. An example embodiment of filler panel 106 is described in greater detail below with reference to FIGS. 2A-2B, and an additional example embodiment is described in greater detail below with reference to FIG. 3.

FIG. 2A illustrates an example filler panel 106, according to certain embodiments of the present disclosure. In some embodiments, filler panel 106 may include electromagnetic shielding base 202, base cover 204, and air dam 206. Electromagnetic shielding base 202 may be coupled to base cover 204 through any appropriate means, including tooled, toolless, or casting fastening mechanisms. In some embodiments, electromagnetic shielding base 202 is coupled to base cover 204 through a snap-in mechanism as described in more detail below with reference to FIG. 2B. Filler panel 106 may also, in some embodiments, include air dam 206 coupled to electromagnetic shielding base 202. As described in more detail below with reference to FIG. 2B, air dam 206 may be removably coupled to electromagnetic shielding base 202 through use of a snap-in mechanism. The snap-in mechanisms used in some embodiments may have the benefit of reducing manufacturing costs for filler panel 106 by eliminating excess tooling, as well as allowing for modularity in design customization. For instance, the manufacturer of filler panel 106 may produce the same electromagnetic shielding base 202 for different systems 100 for different end-users, while still being able to customize the aesthetic appearance of those various systems 100 by customizing the color of base cover 204 to match the required configuration of a particular end-user.

In some embodiments, electromagnetic shielding base 202 may be manufactured from a conductive material such as a conductive polymer or metal. In other embodiments, electromagnetic shielding base 202 may be manufactured from a nonconductive material, such as plastic, and partially or completely covered in a layer or layers of conductive paint and/or conductive shielding.

In the illustrated example, electromagnetic shielding base 202 is constructed of a conductive polymer in order to reduce the overall cost of filler panel 106. Electromagnetic shielding base 202 may perform the bulk of the necessary electromagnetic shielding and/or air flow blocking required of filler panel 106 within shelf 102. Given the variety of configurations of system 100, filler panel 106 may be of any necessary size and the electromagnetic shielding requirements may differ from configuration to configuration. As a result, the conductivity required of electromagnetic shielding base 202 may vary based on the chosen configuration. In the illustrated example, electromagnetic shielding base 202 has been chosen to provide sufficient electromagnetic shielding and air flow for a standard-sized shelf for optical networking, such as the Fujitsu Flashwave 9500 series.

In some embodiments, electromagnetic shielding base 202 may include one or more shielding base snap-in tab(s) 203. Shielding base snap-in tab 203 may be configured to be inserted into an appropriately shaped receptacle of an unused slot of shelf 102 in a manner that provides firm fastening of electromagnetic shielding base 202 to shelf 102. This coupling may have the advantage of easing the installation and removal processes of filler panel 106. In the example embodiment, shielding base snap-in tab 203 is made up a substantially rectangular tab configured to snap into shelf 102.

In some embodiments, base cover 204 is removably coupled to electromagnetic shielding base 202. In the example embodiment, base cover 204 is manufactured from a standard, nonconductive plastic. Manufacturing base cover 204 from such a low-cost material provides several advantages. First, the cost of filler panel 106 may be reduced by reducing the volume of material required to be manufactured from more expensive conductive materials. Second, the material properties of this low-cost material may be better known than those used in electromagnetic shielding base 202. For instance, the material properties of conductive polymers are still poorly understood relative to lower cost materials such as nonconductive plastics. As a result, base cover 204 may be designed to ensure that end-users do not break base cover 204. End-users not used to handling conductive polymers may be insufficiently careful in their handling. Lower cost materials, such as plastics, may be more easily handled. Finally, using lower cost materials in base cover 204 may have the added benefit of eliminating a secondary process used to add color to base cover 204. For example, a manufacturer or supplier of filler panel 106 may desire to customize the color of the visible portions of filler panel 106 in an inexpensive, consistent manner. Using low cost plastics may allow the manufacturer or supplier to mold base cover 204 with a predetermined color in a single process. This may allow the coloring to be done consistently as well. Additional indicators, such as text or labels, may also be inexpensively added or modified to base cover 204 as necessary.

In some embodiments, base cover 202 may also include lateral conductivity member 205. Lateral conductivity member 205 may be configured to make contact with an adjacent filler panel 106 or communication device 104 of system 100. This may be used to create continuous connectivity between all communication devices 104 and filler panels 106 of system 100. This continuous connectivity may help to increase the electromagnetic shielding effect of filler panel 106. In some embodiments, lateral conductivity member 205 may be an integral piece of electromagnetic shield base 202. In other embodiments, lateral conductivity member 205 may be a separate member coupled to electromagnetic shielding base 202, and manufactured from the same or different conductive material as electromagnetic shielding base 202. Lateral conductivity member 205 may also, in some embodiments, be flexibly coupled to electromagnetic shielding base 202 in order to provide a more flexible connectivity to other filler panels 106 and/or communication devices 104 of system 100.

To provide increased effectiveness in air flow blocking, filler panel 106 may, in some embodiments, also include air dam 206. Air dam 206 may be configured to force the flow of air within system 100 along a certain route, such as along the length of air dam 206. This may be used to create an internal airflow barrier. In the example embodiment, air dam 206 is manufactured from a standard, nonconductive plastic. Cost reductions in manufacturing filler panel 106 may be further improved by using lower cost materials, such as plastics, in manufacturing air dam 206. In most configurations, the electromagnetic shielding requirements do not require air dam 206 to be created from conductive materials. Additionally, because air dam 206 may not be visible to users once filler panel 106 is installed in shelf 102, there may be no need for air dam 206 to be constructed of customizable materials. Air dam 206 may therefore be mass produced from standard, low-cost materials.

Depending on the chosen configuration of filler panel 106, a manufacturer or supplier may manufacture electromagnetic shielding base 202, base cover 204, and air dam 206 out of three different materials. These three components may be removably coupled to one another as described in more detail below with reference to FIG. 2B.

FIG. 2B illustrates example filler panel 106 separated into its components, according to certain embodiments of the present disclosure. In some embodiments, filler panel 106 may include electromagnetic shielding base 202, base cover 204, and air dam 206. As discussed in more detail above with reference to FIG. 2A, electromagnetic shielding base 202 may be removably coupled to base cover 204. In some embodiments, electromagnetic shielding base 202 may also include lateral conductivity member 205, as described in more detail above with reference to FIG. 2B.

In some embodiments, base cover 204 may include base cover snap-in tab 212, and electromagnetic shielding base 202 may include first snap-in slot 210. First snap-in slot 210 may be configured to accept base cover snap-in tab 212 in a manner that provides firm fastening of base cover 204 to electromagnetic shielding base 202. This coupling may have the advantage of modular manufacturing of the various components of filler panel 106, as described in more detail above with reference to FIG. 2A. In the example embodiment, first snap-in slot 210 is made up of two substantially rectangular holes configured to accept base cover snap-in tab 212. Likewise, base cover snap-in tab 212 may be made up of two substantially rectangular tabs configured to snap into first snap-in slot 210.

In some embodiments, air dam 206 may include air dam snap-in tab 208. Air dam snap-in tab 208 may be configured to be inserted into second snap-in slot 214 of electromagnetic shielding base 202. In the example embodiment, air dam snap-in tab 208 is made up of three substantially rectangular tabs configured to snap into the three substantially rectangular holes making up second snap-in slot 214 of electromagnetic shielding base 202.

Although the example embodiment shows a specific number of tabs and slots as illustrative of the manner in which base cover 204 may be removably coupled to electromagnetic shielding base 202, and air dam 206 may be removably coupled to electromagnetic shielding base 202, the illustration should not be read to limit the scope of the present disclosure. The components of filler panel 106 may be removably coupled by any appropriate means configured to achieve the goals of the present disclosure. For instance, base cover 204 may be removably coupled to electromagnetic shielding base 202 through use of tooling, such as screws or bolts. Additionally, the snap-in embodiments may be implemented using more or fewer slots or tabs, or having the slots and/or tabs implemented in different configurations. An alternative illustration of filler panel 106 is described in more detail below with reference to FIG. 3.

FIG. 3 illustrates an example filler panel 300, according to certain embodiments of the present disclosure. Filler panel 300 may include electromagnetic shielding base 310, base cover 312 removably coupled to electromagnetic shielding base 310, and air dam 308 coupled to base cover 312. In the illustrated embodiment, air dam 308 and base cover 312 are an integral piece. This piece may be made from various nonconductive materials, as described in more detail above with reference to FIG. 2A. Air dam 308 may be configured to extend from base cover 312 through electromagnetic shielding base 310.

In some embodiments, base cover 312 may be removably coupled to electromagnetic shielding base 310 through use of snap-in tab 302 and snap-in slot 304. In the example embodiment, snap-in tab 302 extends from a side of base cover 312, including a flared portion 306 configured to extend through snap-in slot 304 and prevent snap-in tab 302 from reversing insertion, so that base cover 312 is fastened firmly to electromagnetic shielding base 310.

As described in more detail above with reference to FIG. 2A, base cover 312 and air dam 308 may be made from low-cost, nonconductive material. In some configurations of filler panel 300, further cost reductions may be achieved by creating base cover 312 and air dam 308 in a single manufacturing process. As also described in more detail above with reference to FIG. 2A, electromagnetic shielding base 310 may also include lateral conductivity member 305.

Although the present disclosure has been described in detail, it should be understood that various changes, substitutions, and alterations can be made hereto without departing from the spirit and the scope of the disclosure as defined by the appended claims.

What is claimed is:

1. A filler panel for blocking an unused slot of an electronics shelf system, comprising:
    an electromagnetic shielding base configured to be removably coupled to and substantially cover the unused slot of the electronics shelf system;
    a base cover configured to be removably coupled to the electromagnetic shielding base; and
    an air dam coupled to either the electromagnetic shielding base or the base cover, the air dam configured to force the flow of air within the electronics shelf system along a length of the air dam to create a barrier to the flow of air into the unused slot.

2. The filler panel of claim 1, wherein the base cover is composed substantially of nonconductive material.

3. The filler panel of claim 1, wherein the electromagnetic shielding base is composed substantially of conductive plastic.

4. The filler panel of claim 1, wherein the electromagnetic shielding base is composed substantially of nonconductive plastic substantially covered with a conductive coating layer.

5. The filler panel of claim 1, wherein the base cover is removably coupled to the electromagnetic shield base through a snap-in mechanism.

6. The filler panel of claim 1, wherein the air dam is composed substantially of nonconductive material.

7. A filler panel for blocking an unused slot of an electronics shelf system, comprising:
   an electromagnetic shielding base configured to be removably coupled to and substantially cover the unused slot of the electronics shelf system;
   a base cover configured to be removably coupled to the electromagnetic shielding base; and
   an air dam coupled to either the electromagnetic shielding base or the base cover, wherein the air dam and the base cover are an integral piece, the air dam configured to force the flow of air within the electronics shelf system along a length of the air dam to create a barrier to the flow of air into the unused slot.

8. An electronics shelf system for supporting an electronic device, comprising:
   a shelf; and
   a filler panel configured to be removably coupled to the shelf, the filler panel comprising:
      an electromagnetic shielding base configured to substantially cover an unused slot of the shelf;
      a base cover configured to be removably coupled to the electromagnetic shielding base; and
      an air dam coupled to either the electromagnetic shielding base or the base cover, the air dam configured to force the flow of air within the electronics shelf system along a length of the air dam to create a barrier to the flow of air into the unused slot.

9. The electronics shelf system of claim 8, wherein the base cover is composed substantially of nonconductive material.

10. The electronics shelf system of claim 8, wherein the electromagnetic shielding base is composed substantially of conductive plastic.

11. The electronics shelf system of claim 8, wherein the electromagnetic shielding base is composed substantially of nonconductive plastic substantially covered with a conductive coating layer.

12. The electronics shelf system of claim 8, wherein the base cover is removably coupled to the electromagnetic shield base through a snap-in mechanism.

13. The electronics shelf system of claim 8, wherein the air dam is composed substantially of nonconductive material.

14. An electronics shelf system for supporting an electronic device, comprising:
   a shelf; and
   a filler panel configured to be removably coupled to the shelf, the filler panel comprising:
      an electromagnetic shielding base configured to substantially cover an unused slot of the shelf;
      a base cover configured to be removably coupled to the electromagnetic shielding base; and
      an air dam coupled to either the electromagnetic shielding base or the base cover, wherein the air dam and the base cover are an integral piece, the air dam configured to force the flow of air within the electronics shelf system along a length of the air dam to create a barrier to the flow of air into the unused slot.

* * * * *